United States Patent
Lin et al.

(10) Patent No.: US 11,515,252 B2
(45) Date of Patent: Nov. 29, 2022

(54) LAYOUT OF WORDLINE AND METHOD OF FORMING THE SAME

(71) Applicant: Winbond Electronics Corp., Taichung (TW)

(72) Inventors: Tsung-Wei Lin, Taichung (TW); Chun-Yen Liao, Taoyuan (TW); Chun-Sheng Wu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/345,391

(22) Filed: Jun. 11, 2021

(65) Prior Publication Data

US 2022/0181249 A1    Jun. 9, 2022

(30) Foreign Application Priority Data

Dec. 7, 2020   (TW) .................................. 109143020

(51) Int. Cl.
  *H01L 21/00*    (2006.01)
  *H01L 23/528*   (2006.01)
  *H01L 21/768*   (2006.01)

(52) U.S. Cl.
  CPC ...... *H01L 23/528* (2013.01); *H01L 21/76816* (2013.01)

(58) Field of Classification Search
  CPC .................... H01L 23/528; H01L 21/76816
  See application file for complete search history.

(56) References Cited

U.S. PATENT DOCUMENTS

| | | | |
|---|---|---|---|
| 6,713,806 B2* | 3/2004 | Wang | H01L 28/91 257/E21.309 |
| 7,645,644 B2* | 1/2010 | Sel | H01L 27/115 438/129 |
| 8,318,603 B2* | 11/2012 | Lee | H01L 21/31144 438/700 |
| 8,406,028 B1* | 3/2013 | Lin | G11C 11/412 257/E23.021 |
| 9,343,670 B2* | 5/2016 | Pellizzer | H01L 45/122 |
| 10,872,857 B1* | 12/2020 | Otsu | H01L 23/5226 |

(Continued)

FOREIGN PATENT DOCUMENTS

| | | | |
|---|---|---|---|
| KR | 20070092549 A | 9/2007 | |
| KR | 20080001441 A | 1/2008 | |
| WO | WO-2014184299 A1 * | 11/2014 | ......... G11C 11/4045 |

*Primary Examiner* — Laura M Menz

(74) *Attorney, Agent, or Firm* — Muncy, Geissler, Olds & Lowe, P.C.

(57) ABSTRACT

A word line layout includes a substrate, a first word line group, a second word line group, and an I-shaped third word line. The first word line group is disposed on the substrate and includes a plurality of L-shaped first word lines, and each of the first word lines has a first segment and a second segment connected to each other. The second word line group is disposed on the substrate and includes a plurality of L-shaped second word lines, and each of the second word lines has a first segment and a second segment connected to each other. The first word line group and the second word line group are arranged in juxtaposition and symmetric to each other. The I-shaped third word line is disposed on the outer side of the first word line group and the second word line group.

20 Claims, 9 Drawing Sheets

(56) References Cited

U.S. PATENT DOCUMENTS

| | | | | |
|---|---|---|---|---|
| 2001/0002702 A1* | 6/2001 | Takemura | ........... | G11C 11/4097 |
| | | | | 257/E27.097 |
| 2002/0126520 A1* | 9/2002 | Takemura | ......... | H01L 27/10894 |
| | | | | 257/E27.097 |
| 2003/0142528 A1* | 7/2003 | Takemura | ......... | H01L 27/10897 |
| | | | | 257/E27.097 |
| 2003/0227063 A1* | 12/2003 | Sel | ...................... | H01L 27/0207 |
| | | | | 257/E27.103 |
| 2004/0080971 A1* | 4/2004 | Takemura | ........... | G11C 11/4097 |
| | | | | 257/E27.097 |
| 2005/0105332 A1* | 5/2005 | Shih | .................. | H01L 27/11524 |
| | | | | 257/E27.103 |
| 2006/0273457 A1* | 12/2006 | Sel | ........................ | H01L 27/105 |
| | | | | 257/734 |
| 2008/0106922 A1* | 5/2008 | Park | .................... | G11C 13/0004 |
| | | | | 365/72 |
| 2008/0206932 A1* | 8/2008 | Sel | ........................ | H01L 27/115 |
| | | | | 257/E27.081 |
| 2012/0156876 A1* | 6/2012 | Chen | ................. | H01L 27/11524 |
| | | | | 438/689 |
| 2017/0179154 A1* | 6/2017 | Furihata | ............ | H01L 27/11575 |
| 2019/0115358 A1* | 4/2019 | Lee | ................... | H01L 27/11556 |
| 2020/0098787 A1* | 3/2020 | Kaneko | ............ | H01L 29/40117 |
| 2020/0371426 A1* | 11/2020 | Lin | .......................... | G03F 1/40 |
| 2021/0225767 A1* | 7/2021 | Lee | ...................... | H01L 23/528 |
| 2022/0108894 A1* | 4/2022 | Chou | ............... | H01L 27/11521 |
| 2022/0181249 A1* | 6/2022 | Lin | ...................... | H01L 23/528 |

* cited by examiner

LAYOUT OF WORDLINE AND METHOD OF FORMING THE SAME

PRIORITY

This application claims priority of Taiwan Patent Application No. 109143020, filed on Dec. 7, 2020, the entirety of which is incorporated by reference herein.

BACKGROUND

Field of the Disclosure

The present disclosure relates to semiconductor, and in particular, to the layout of a word line and a method of forming the same.

Description of the Related Art

Since flash memory has the advantages of high density, low cost, rewritability, and erasability, it has become popular in non-volatile memory elements and is now widely used in a variety of electronic products, such as notebooks, digital cameras, cellphones, game consoles, and other products. In order to increase the density of components in the flash memory device and improve overall performance of the flash memory, the technique of manufacturing the flash memory continues to scale down the size of the elements.

In the process of manufacturing a semiconductor device, various components are typically patterned through lithography and etching processes. However, as elements continue to be scaled down in size, many challenges arise. For example, when a semiconductor structure is formed, the environment of the patterning process (e.g. self-aligned double patterning process (SADP)) may adversely affect the semiconductor structure, leading to reduction in reliability and yield.

Although existing flash memories and the method of forming the same have been adequate for their intended purposes, they are not satisfactory in all aspects. Therefore, an improved flash memory device and a method of forming the same are required to overcome drawbacks accompanying with the scaling down of device so that the process tolerance may be increased and the manufacturing cost may be reduced.

SUMMARY

Some embodiments of the present disclosure provide a word line layout, which includes a substrate, a first word line group, a second word line group, and an I-shaped third word line. The first word line group is disposed on the substrate and includes a plurality of L-shaped first word lines, and each of the first word lines has a first segment and a second segment connected to each other. The first segment extends in a first direction, and the second segment extends in a second direction, which is perpendicular to the first direction. The second word line group is disposed on the substrate and includes a plurality of L-shaped second word lines, and each of the second word lines has a first segment and a second segment connected to each other. The first segment extends in the first direction and the second segment extends in the second direction. The first word line group and the second word line group are arranged in juxtaposition and symmetric to each other with respect to a symmetry axis parallel to the second direction. The I-shaped third word line is disposed on the outer side of the first word line group and the second word line group. The I-shaped third word line extends in the first direction and crosses the symmetry axis.

Some embodiments of the present disclosure provide a method of forming a word line layout, which includes the following steps. A substrate is provided. A mask layer is formed on the substrate. The mask layer is patterned to form a patterned mask layer The patterned mask layer includes a plurality of L-shaped first masks, a plurality of L-shaped second masks, and a T-shaped third mask. The L-shaped first masks and the L-shaped second masks are arranged in juxtaposition and symmetric to each other, and a portion of the T-shaped third mask is disposed between the L-shaped first masks and the L-shaped second masks. A plurality of spacers are formed on sidewalls of the patterned mask layer. The patterned mask layer is removed and the spacers are left. The spacers form a word line layout.

DETAILED DESCRIPTION OF THE DISCLOSURE

Figure 1:
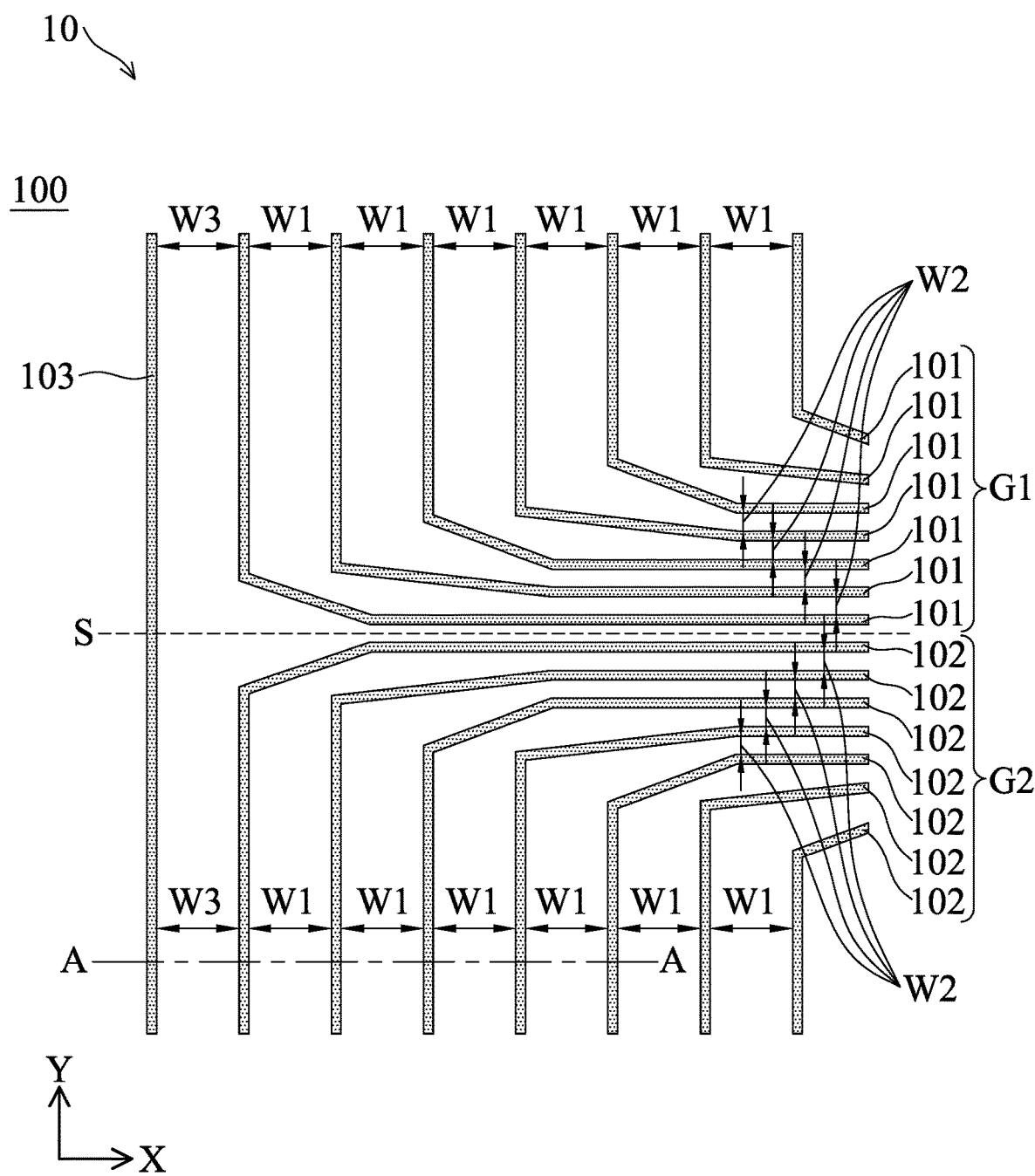
FIG. 1 illustrates a schematic top view of a word line layout, in accordance with some embodiments of the present disclosure.
Figure 2:
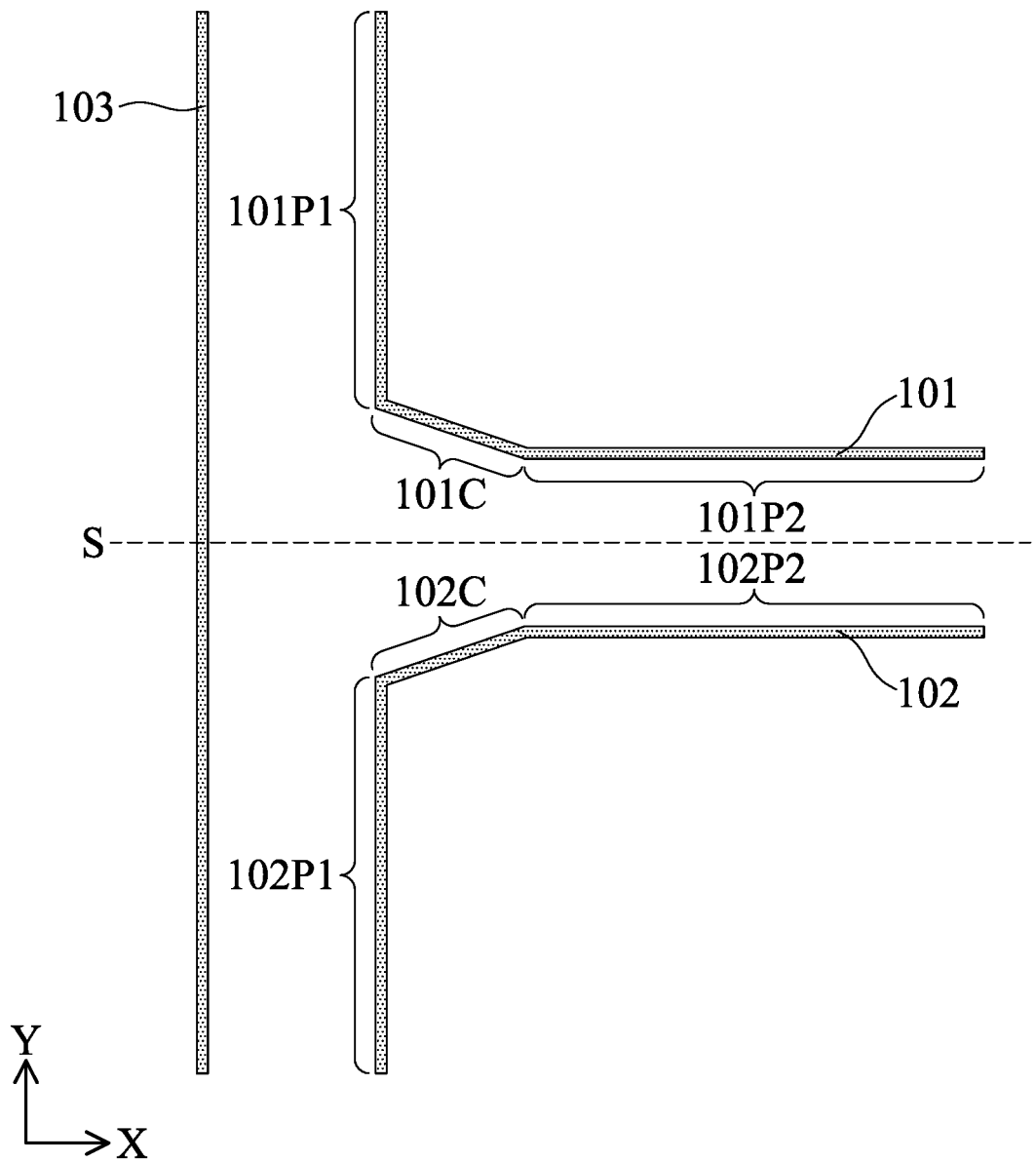
FIG. 2 illustrates a schematic top view of a portion of a word line layout, in accordance with some embodiments of the present disclosure.
Figure 3:
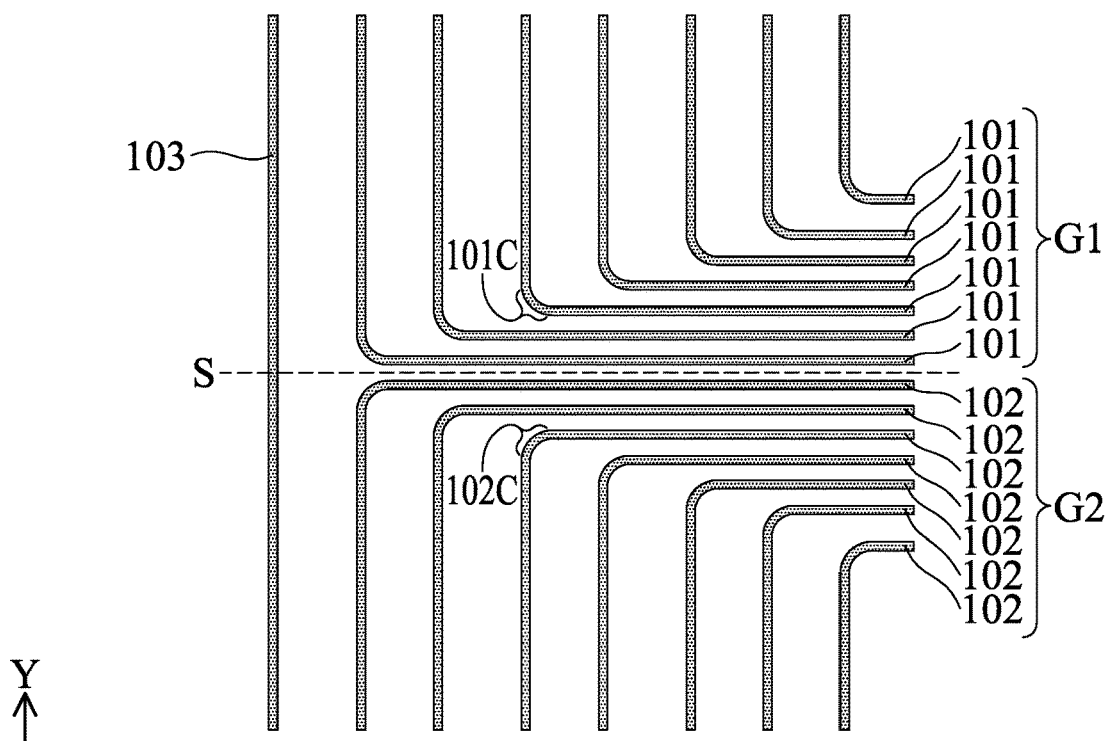
FIGS. 3-5 illustrate schematic top views of a word line layout, in accordance with some embodiments of the present disclosure.

FIGS. 1-3 illustrate top views of a word line layout, in accordance with some embodiments of the present disclosure. Referring FIG. 1, the word line layout 10 includes: a substrate 100, a first word line group G1, a second word line group G2, and an I-shaped third word line 103. The first word line group G1 is disposed on the substrate 100 and includes a plurality of L-shaped first word lines 101. The second word line group G2 is disposed on the substrate 100 and includes a plurality of L-shaped second word lines 102. The first word line group G1 and the second word line group G2 are arranged in juxtaposition, and the word line groups G1 and G2 are symmetric to each other with respect to a symmetry axis S. The symmetry axis S is parallel to a second direction X. The I-shaped third word line 103 is disposed on the outer side of the first word line group G1 and the second word line group G2, and the I-shaped third word line 103 extends in a first direction Y and crosses the symmetry axis S. In some embodiments, all the word lines of the word line layout 10 are symmetric with respect to the symmetry axis S. It can be understood that the number of the illustrated word lines is only an example and not to limit the embodiments of the present disclosure. Furthermore, both ends of the word lines may extend to connect with other features, or one end of the word lines may extend to connect with other features.

FIG. 2 further illustrates a partial top view of the word line layout 10, where only the I-shaped third word line 103 and a set of one L-shaped first word line 101 and one L-shaped second word line 102 symmetric to each other are illustrated for clarity and illustrative purpose. Referring FIG. 2, each of the first word lines 101 has a first segment 101P1 and a second segment 101P2 connected to each other. The first segment 101P1 extends in the first direction Y, and the second segment 101P2 extends in a second direction X perpendicular to the first direction Y. Similarly, each of the second word line 102 has a first segment 102P1 and a second segment 102P2 connected to each other. The first segment 102P1 extends in the first direction Y, and the second segment 102P2 extends in the second direction X, the I-shaped third word line 103 disposed on the outer side of the first word line group G1 and the second word line group G2 means that the I-shaped third word line 103 is disposed on a side in a direction opposite to the second direction X (That is, –X direction) of the first word line group G1 and the second word line group G2. According to some embodiments of the present disclosure, the connected first segments 101P1 and second segments 101P2 of the first word lines 101 in the first word line group G1 are connected to each other at positions adjacent to the symmetry axis S, and the connected first segments 102P1 and second segments 102P2 of the second word lines 102 in the second word line group G2 are also connected to each other at positions adjacent to the symmetry axis S. Referring FIG. 1, the positions where the first segments 101P1 and the corresponding second segments 101P2 in the first word line group G1 are connected to each other move away from the symmetry axis S as the first word lines 101 move away from third word line 103, and the positions where the first segments 102P1 and the corresponding second segments 102P2 in the second word line group G2 are connected to each other move away from the symmetry axis S as the second word lines 102 move away from third word line 103.

Still referring FIGS. 1 and 2, in some embodiments, in the first word line group G1, spacings between adjacent ones of the first word lines 101 in the first direction Y or the second direction X are equal, and in the second word line group G2, spacings between adjacent ones of the second word lines 102 in the first direction Y or the second direction X are equal. Specifically, in the first word line group G1, adjacent first segments 101P1 have the same spacing W1, and adjacent second segments 101P2 have the same spacing W2. In addition, since the first word line group G1 and the second word line group G2 are symmetric to each other with respect to the symmetry axis S, in the second word line group G2, adjacent first segments 102P1 have the same spacing W1, and adjacent second segments 102P2 have the same spacing W2. According to some embodiments of the present disclosure, the spacing W1 is greater than 20 nm, and the spacing W2 is greater than 20 nm. In other embodiments, spacings between adjacent first segments 101P1 of the first word line group G1 may be different, and spacings between adjacent second segments 101P2 of the first word line group G1 may also be different. Since the first word line group G1 and the second word line group G2 are symmetric to each other with respect to the symmetry axis S, in the second word line group G2, the spacings between adjacent first segments 102P1 and the spacings between adjacent second segments 102P2 are respectively equal to the spacings between the corresponding adjacent first segments 101P1 and the spacings between the corresponding adjacent second segments 101P2 in the first word line group G1.

In some embodiments, the spacing W3 between the third word line 103 and the first word line group G1 and the second word line group G2 is greater than or equal to the spacing W1 between adjacent ones of the first segments 101P1 of the first word lines 101 and greater than or equal to the spacing W1 between adjacent ones of the first segments 102P1 of the second word lines 102. In an embodiment, the spacing W3 may be greater than the spacing W1 and the spacing W1 is greater than 20 nm. In this case, the third word line 103 may be farther away from the first word line group G1 and the second word line group G2 so that the third word line 103 is not shown in a partial top view of the word line layout, in the first word lines 101, the spacing W1 between adjacent ones of the first segments 101P1 is greater than the spacing W2 between adjacent ones of the second segments 101P2, and in the second word lines 102, the spacing W1 between adjacent ones of the first segments 102P1 is greater than the spacing W2 between adjacent ones of the second segments 102P2.

In the word line layout 10, by disposing the word line 103 on the outer side of the first word line group G1 and the second word line group G2, the edges of the first word line group G1 and the second word line group G2 are not in an isolated environment. This may prevent cracking or necking in the first word line group G1 and the second word line group G2 during subsequent processing, and may improve the process tolerance or yield, the spacing W3 between the third word line 103 and the first word line group G1 and the second word line group G2, or the spacing W1 or W2 between the segments of the first word line group G1 and the second word line group G2 may be adjusted to achieve a symmetric, uniform, or dense word line layout so that cracking or necking in the word lines may be avoided under different processing conditions or design requirements, and thereby the process tolerance or yield may be improved.

Figure 4:
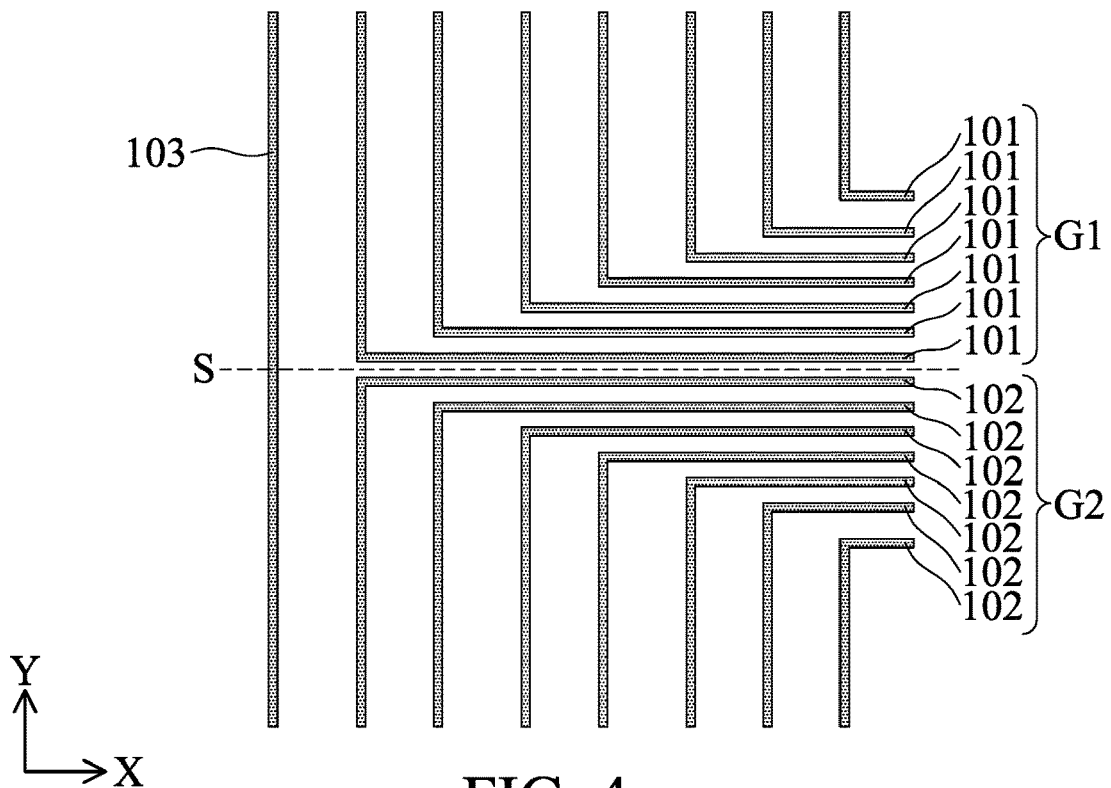

Referring FIG. 2, the first word line 101 may have a connection segment 101C that connects the first segment 101P1 and the second line 101P2, and the second word line 102 may have a connection segment 102C that connects the first segment 102P1 and the second segment 102P2. In the example shown in FIG. 2, the connection segments 101C and 102C are straight lines, the connection segments 101C and 102C are curves, as shown in FIG. 3. Alternatively, the first segment 101P1 and the second segment 101P2 of the first word line 101 may be directly connected and the first segment 102P1 and the second segment 102P2 of the second word line 102 may be directly connected without the connection segments 101C and 102C, as shown in FIG. 4.

Figure 5:
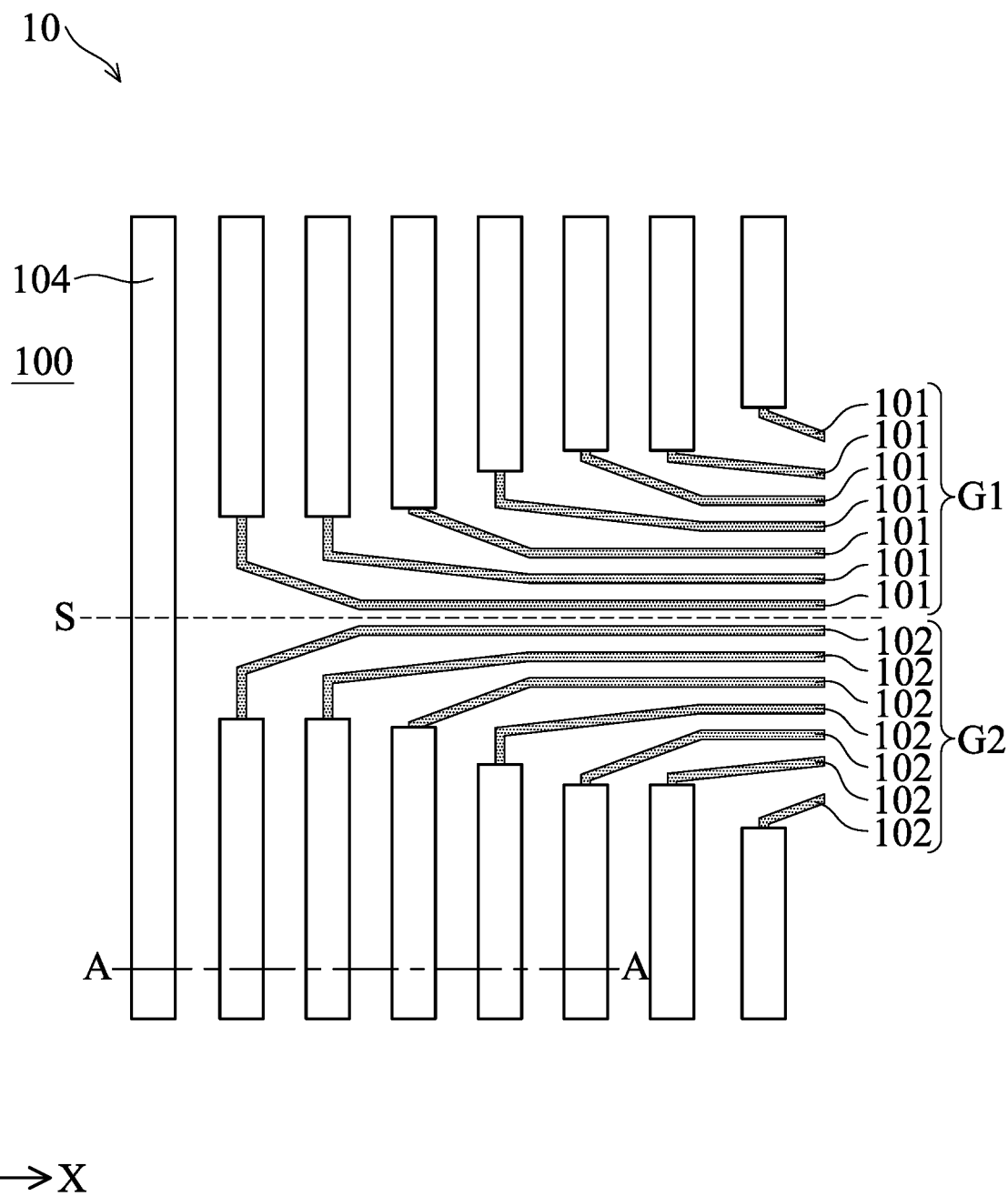

Referring FIG. 5, the word line layout 10 may include a plurality of protection layers 104. The protection layers 104 are disposed on the first segments 101P1 of the first word line 101 and the first segments 102P1 of the second word line 102, the material of the protection layer 104 includes undoped silicon, another protection layer 104 is also disposed on the third word line 103, the material of the first word lines 101, the second word lines 102, and the protection layers 104 may respectively include: carbon, silicon oxynitride, nitride, oxide, oxide-nitride-oxide (ONO), polysilicon (polycrystalline silicon), cobalt, cobalt silicide ($CoSi_2$), metal, and resist material, the material of the first word lines 101 and the second word lines 102 is different from the material of the protection layers 104.

Figure 6A:
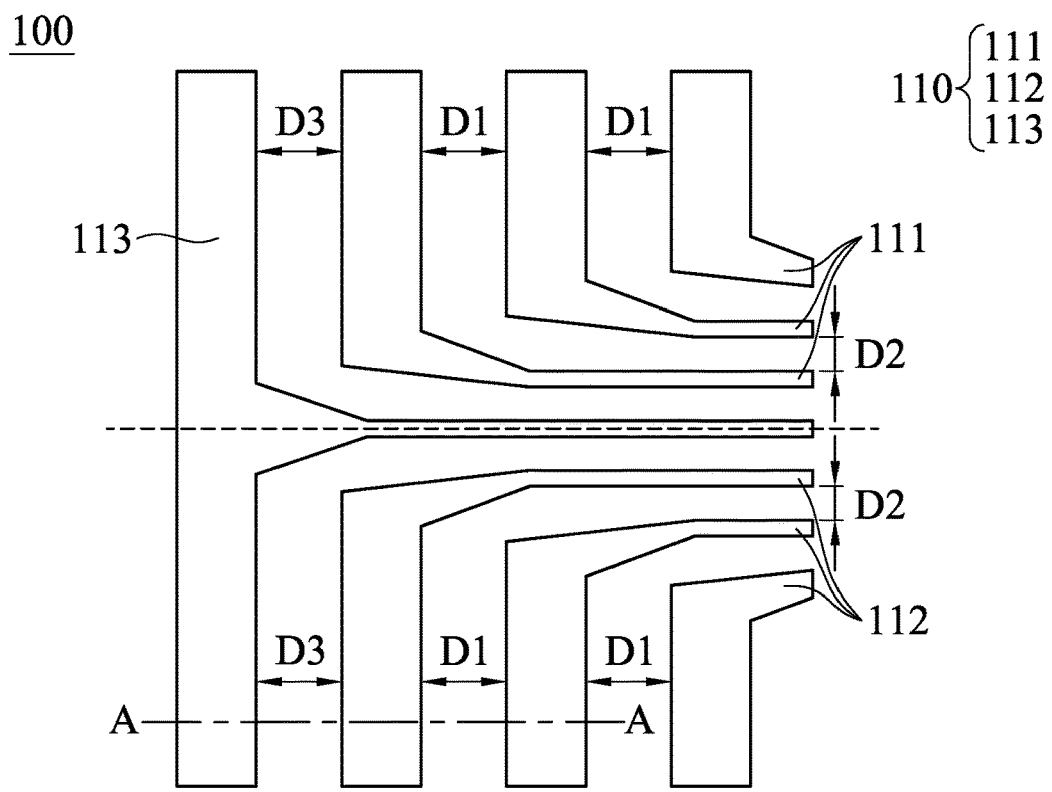
FIG. 6A illustrates a schematic top view of a word line layout during fabrication processes, in accordance with some embodiments of the present disclosure.
Figure 6B:
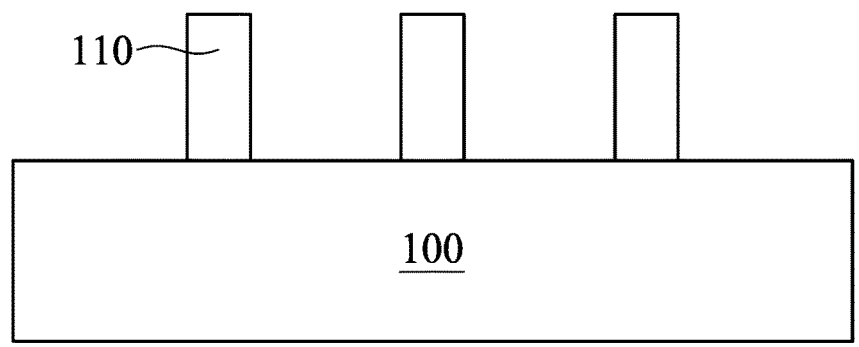
FIG. 6B illustrates a schematic cross-sectional view of a word line layout during fabrication processes, in accordance with some embodiments of the present disclosure.
Figure 7:
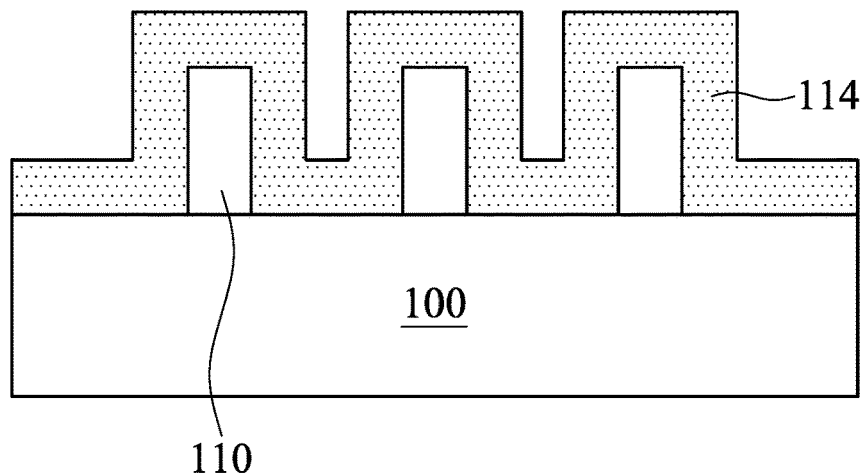
FIG. 7 illustrates a schematic cross-sectional view of a word line layout during fabrication processes, in accordance with some embodiments of the present disclosure.
Figure 8A:
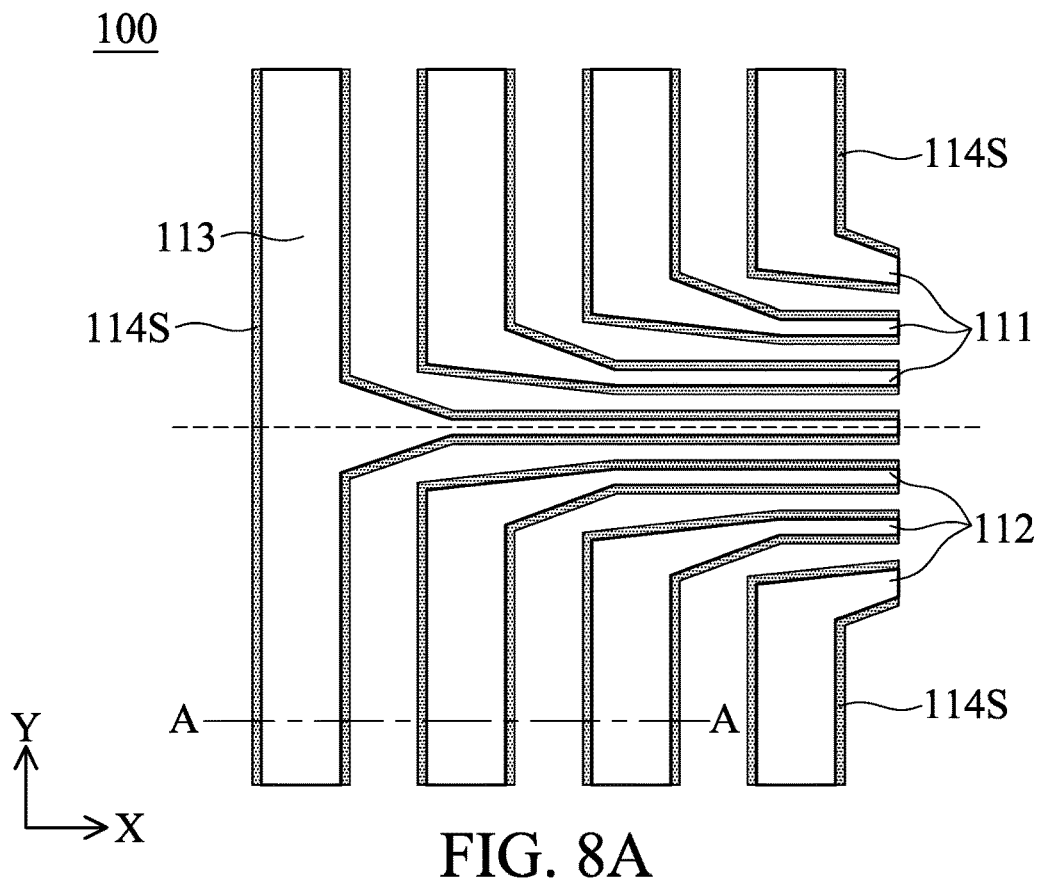
FIG. 8A illustrates a schematic top view of a word line layout during fabrication processes, in accordance with some embodiments of the present disclosure.
Figure 8B:
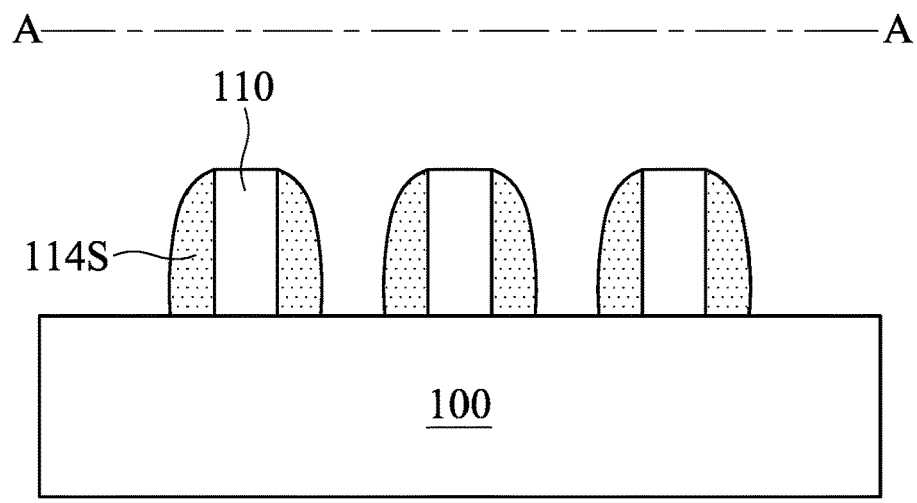
FIG. 8B illustrates a schematic cross-sectional view of a word line layout during fabrication processes, in accordance with some embodiments of the present disclosure.

FIGS. 6A and 8A illustrate top views of a word line layout during fabrication processes, in accordance with some embodiments of the present disclosure. FIGS. 6B, 7, and 8B illustrate cross-sectional views of the word line layout during fabrication processes, in accordance with some embodiments of the present disclosure. FIG. 6B is a cross-sectional view of the structure along line A-A in FIG. 6A. Referring FIGS. 6A and 6B, a substrate 100 is provided. A mask material layer is formed on the substrate 100 and patterned to form a patterned mask layer 110. As shown in FIG. 6A, the patterned mask layer 110 includes a plurality of L-shaped first masks 111, a plurality of L-shaped second masks 112, and a T-shaped third mask 113. The L-shaped first masks 111 and the L-shaped second masks 112 are arranged in juxtaposition and symmetric to each other. A portion of the T-shaped third mask 113 is disposed between the L-shaped first masks 111 and the L-shaped second masks 112.

Figure 6C:
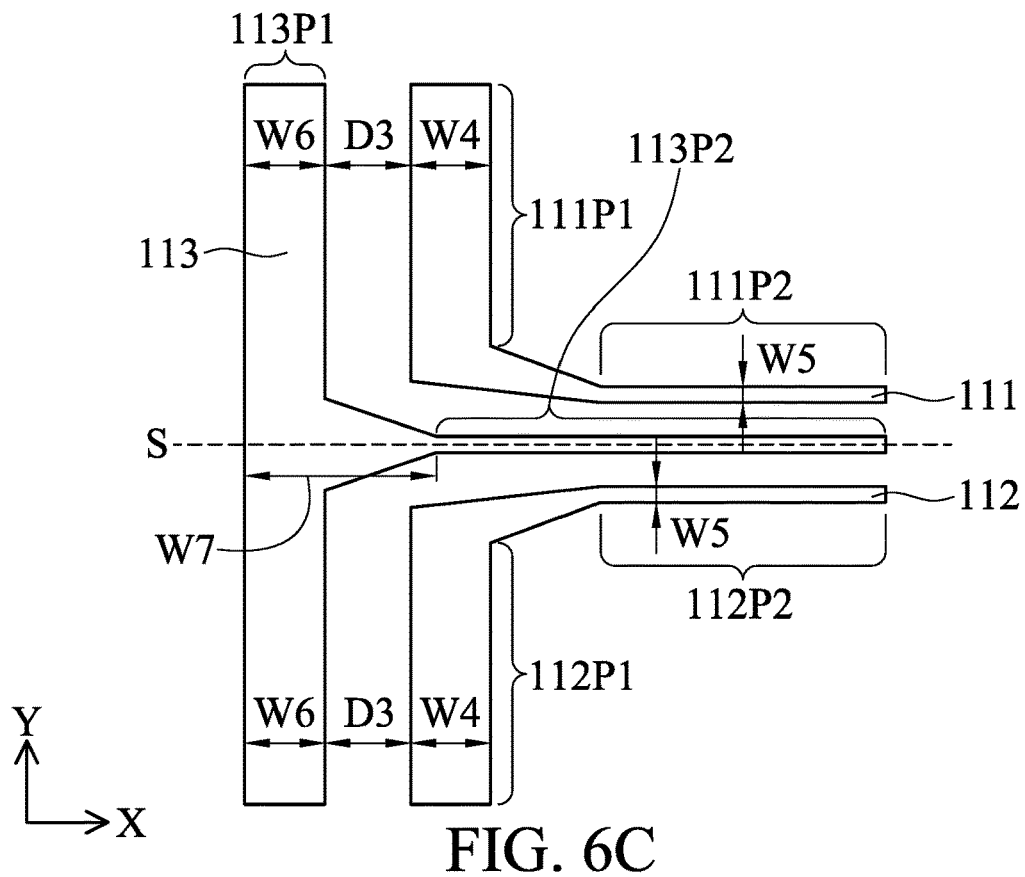
FIG. 6C illustrates a top view of a portion of a word line layout during fabrication processes, in accordance with some embodiments of the present disclosure.

FIG. 6C illustrates a partial top view of the patterned mask layer 110, in accordance with some embodiments of the present disclosure. For clarity and illustrative purpose, only the T-shaped third mask and a set of one L-shaped first mask 111 and one L-shaped second mask 112 are illustrated. The L-shaped first mask 111 and the L-shaped second mask 112 are symmetric to each other. Referring FIG. 6C, the L-shaped first mask 111 has a first portion 111P1 and a second portion 111P2 connected to each other, and the first portion 111P1 extends in the first direction Y and the second portion 111P2 extends in the second direction X. The L-shaped second mask 112 has a first portion 112P1 and a second portion 112P2 connected to each other, and the first portion 112P1 extends in the first direction Y and the second portion 112P2 extends in the second direction X. The L-shaped first mask 111 and the L-shaped second mask 112 are symmetric to each other with respect to the symmetry axis S parallel to the second direction X. The T-shaped third mask 113 includes a first portion 113P1 and a second portion 113P2 connected to each other. The first portion 113P1 is disposed on the outer side of the L-shaped first mask 111 and the L-shaped second mask 112. The first portion 113P1 extends in the first direction Y and crosses the symmetry axis S. The second portion 113P2 is disposed on the symmetry axis S and extends in the second direction X. The outer side means that the first portion 113P1 of the T-shaped third mask 113 is disposed on a side in a direction opposite to the second direction X (That is, −X direction) of the L-shaped first mask 111 and the L-shaped second mask 112. According to some embodiments of the present disclosure, the patterned mask layer 110 is a symmetric structure and has an odd number of masks. For example, in FIG. 6A, the patterned mask layer 110 may include a plurality of L-shaped first masks 111, a plurality of L-shaped second masks 112, and one T-shaped third mask 113. Since the L-shaped first masks 111 are symmetric to the L-shaped second masks 112 with respect to the symmetry axis S, the number (such as n) of the L-shaped first masks 111 is equal to the number (such as n) of the L-shaped second masks 112. Therefore, the number of the masks of the patterned mask layer 110 (including the L-shaped first masks, the L-shaped second masks 112, and one T-shaped third mask 113) is odd (2n+1).

Referring FIGS. 6A and 6C, in some embodiments, the spacing D3 between the first portion 113P1 of the T-shaped third mask 113 and the L-shaped first masks 111 and the L-shaped second masks 112 are equal to the spacing D1 between adjacent first portions 111P1 of the L-shaped first masks 111 and equal to the spacing D1 between adjacent first portions 112P1 of the L-shaped second masks 112, the spacing D2 between adjacent second portions 111P2 of the L-shaped first masks 111 and the spacing D2 between adjacent second portions 112P2 of the L-shaped second masks 112 are less than the spacing D1. In some embodiments shown in FIG. 6A, the spacing D1 is greater than 20 nm, the spacing D2 is greater than 20 nm, and the spacing D3 is greater than 20 nm, the width W4 of the first portion 111P1 of the L-shaped first mask 111 and the first portion 112P1 of the L-shaped second mask 112 is equal to the spacing D3 and the width W6 of the first portion 113P1 of the T-shaped third mask 113, the width W4 of the first portion 111P1 of the L-shaped first mask 111 and the first portion 112P1 of the L-shaped second mask 112 is greater than the width W5 of the second portion 111P2 of the L-shaped first mask 111 and the second portion 112P2 of the L-shaped second mask 112. In some embodiments shown in FIG. 6C, the width W4 is greater than 20 nm, the width W5 is greater than 20 nm, and the width W6 is greater than 20 nm, the T-shaped third mask 113 is designed to be wider in the middle and narrower on opposite sides. For example, referring FIG. 6C, in the second direction X, the middle portion of the T-shaped third mask 113 has a width in the range between W6 and W7 (W7 is greater than W6, and W7 may be greater than 30 nm), which may be greater than the width W6 of the first portion 113P1 on opposite sides of the T-shaped third mask 113. With this configuration, the device may obtain a larger current in low resistance state (LRS), and obtain a smaller current in high resistance state (HRS).

Next, referring FIG. 7, a spacer material layer 114 is conformally deposited on the substrate 100 and on the top surface and sidewalls of the patterned mask layer 110. The material of the spacer material layer 114 may include: oxide, nitride, or polysilicon.

Referring FIGS. 8A and 8B, FIG. 8B is a cross-sectional view of the structure along line A-A in FIG. 8A. The spacer material layer 114 is etched to expose a portion of the top surface of the substrate 100 and expose the top surface of the patterned mask layer 110, and thereby a plurality of spacers 114S are formed on the sidewalls of the patterned mask layer 110. More specifically, the etching process removes the spacer material layer 114 on the portion of the top surface of the substrate 100 and removes the spacer material layer 114 on the top surface of the patterned mask layer 110. As shown in FIG. 8A, the spacers 114S is formed on the sidewalls of the L-shaped first masks 111, the L-shaped second masks 112, and the T-shaped third mask 113.

Figure 9:
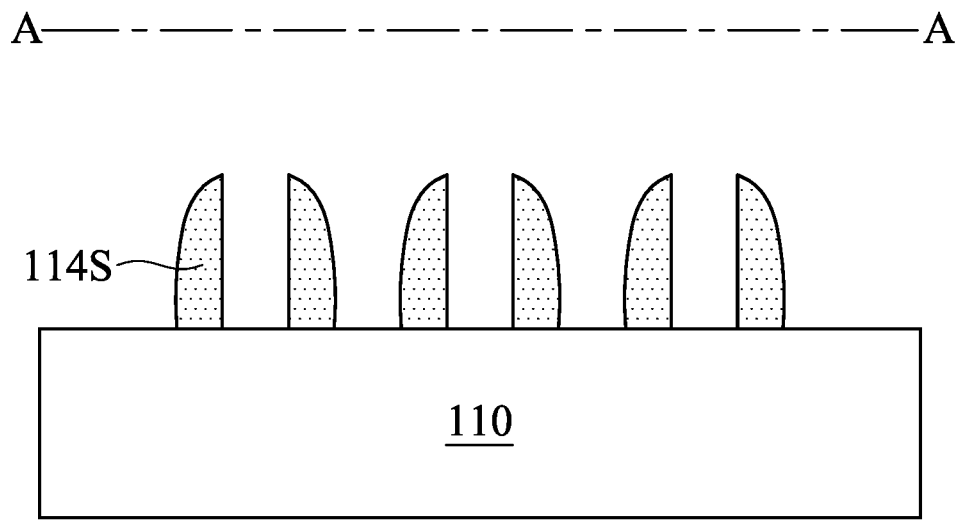
FIG. 9 illustrates a schematic cross-sectional view of a word line layout, in accordance with some embodiments of the present disclosure.

Referring FIGS. 1 and 9, the patterned mask layer 110 is removed and the spacers 114S are left to form the word line layout 10 as shown in FIG. 1. FIG. 9 is a schematic cross-sectional view of the word line layout 10 along line A-A in FIG. 1.

According to the method of forming a word line layout in some embodiments of the present disclosure, a symmetric patterned mask layer is provided so that the desired spacers (or word lines) are not in an isolated environment. This may avoid cracking or necking in the spacers during subsequent processing, and may improve the performance and reliability of the device. For example, referring the spacers 114S on the sidewalls of the T-shaped third mask 113 in FIG. 8A, the spacer 114S on the sidewall away from the L-shaped first masks 111 and the L-shaped second masks 112 may provide the spacer 114S on the sidewall close to the L-shaped first masks 111 and the L-shaped second masks 112 with a non-isolated environment to avoid cracking or necking caused by different processing conditions in the isolated environment, the spacer 114S on the sidewall of the T-shaped third mask 113 away from the L-shaped first masks 111 and the L-shaped second masks 112 may be referred to as auxiliary spacer, which corresponds to the third word line 103 in the word line layout 10 formed after the patterned mask layer 110 is removed.

According to the method of forming a word line layout in some embodiments of the present disclosure, by providing a symmetric patterned mask layer with an odd number of masks (such as the embodiments illustrated in FIG. 6A), the desired spacers are not in an isolated environment or are not in asymmetric structure, and one or more of the advantages described above can be achieved.

Figure 10:
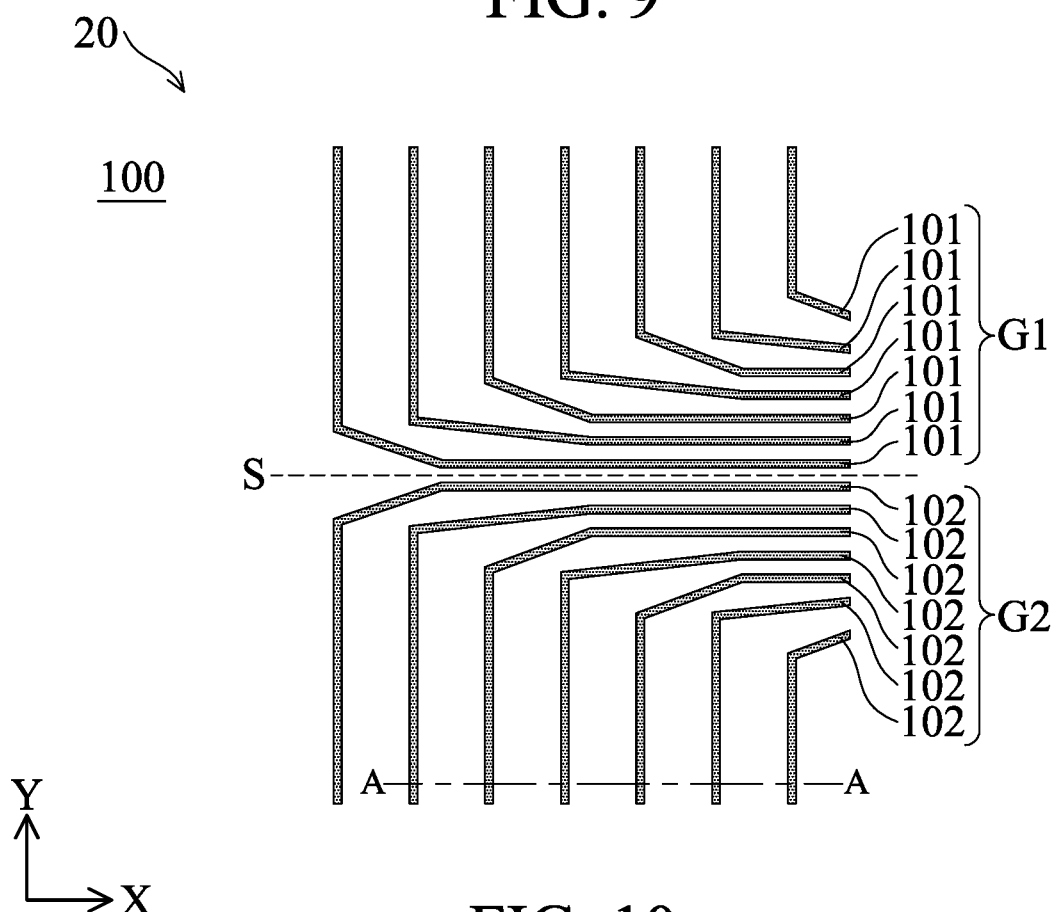
FIGS. 10 and 11 illustrate schematic top views of a word line layout, in accordance with some embodiments of the present disclosure.
Figure 11:
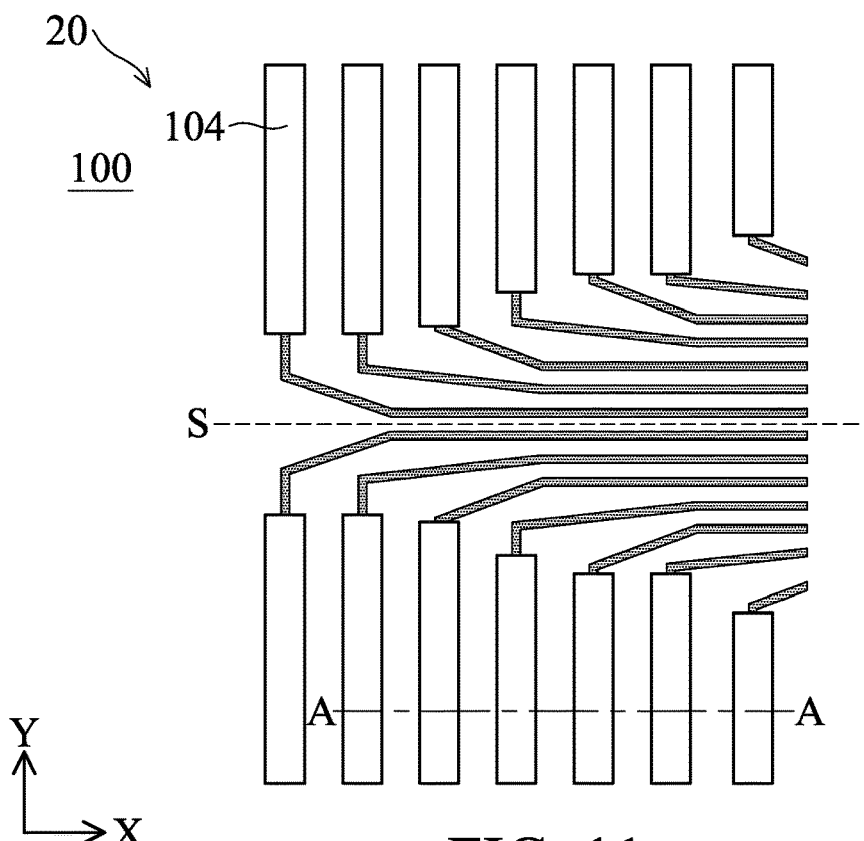
Figure 12:
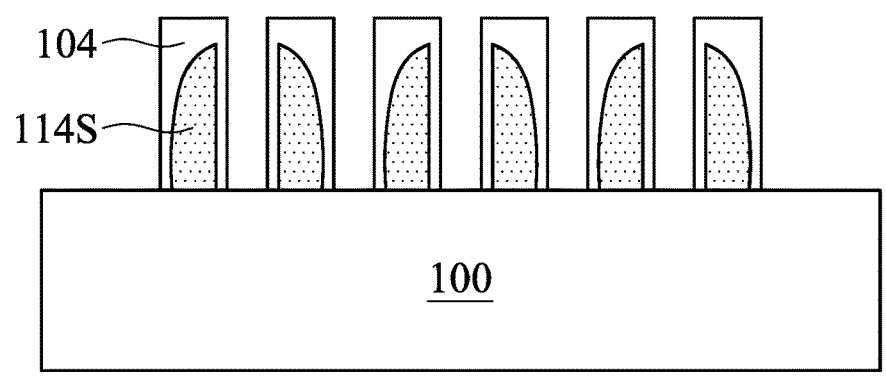
FIG. 12 illustrates a schematic cross-sectional view of a word line layout, in accordance with some embodiments of the present disclosure.

In some embodiments, after the patterned mask layer 110 is removed to form the word line layout 10 in FIG. 1, the third word line 103 may be removed to form the word line layout 20 as shown in FIG. 10. The configuration of the word line layout 20 is similar to that of the word line layout 10, except that the word line layout 20 does not include the third word line 103, a plurality of protection layers 104 may be formed on the first segments 101P1 of the L-shaped first word lines 101 and the first segments 102P1 of the L-shaped second word lines 102, as shown in FIGS. 11 and 12. FIG. 12 is a schematic cross-sectional view of the word line layout 20 along line A-A in FIG. 11. In some embodiments, FIG. 12 may be a schematic cross-sectional view of the word line layout 10 along line A-A in FIG. 5. In addition to the advantages described above, the protection layers 104 may protect the underlying features during subsequent processing, or they may be used as a mask.

Some embodiments of the present disclosure provide a word line layout, which includes a symmetric word line layout. With the word line layout, cracking or necking in the word lines may be avoided in subsequent processing, improving the device's reliability, the process tolerance, and/or the yield. Some embodiments of the present disclosure provide a method of forming a word line layout, which includes forming a symmetric patterned mask layer. During the patterning process, the patterned mask layer may provide a non-isolated environment to avoid cracking or necking in the word lines, and thereby process (such as lithography process or etching process) tolerance may be improved.

What is claimed is:

1. A word line layout, comprising:
   a first word line group disposed on a substrate and comprising a plurality of L-shaped first word lines, and each of the first word lines having a first segment and a second segment connected to each other, wherein the first segment extends in a first direction, the second segment extends in a second direction perpendicular to the first direction;
   a second word line group disposed on the substrate and comprising a plurality of L-shaped second word lines, and each of the second word lines having a first segment and a second segment connected to each other, wherein the first segment extends in the first direction and the second segment extends in the second direction,
   wherein the first word line group and the second word line group are arranged in juxtaposition and symmetric to each other with respect to a symmetry axis parallel to the second direction; and
   an I-shaped third word line disposed on an outer side of the first word line group and the second word line group, wherein the I-shaped third word line extends in the first direction and crosses the symmetry axis.

2. The word line layout as claimed in claim 1, wherein the connected first segments and second segments of the first word lines and the second word lines are connected to each other at positions adjacent to the symmetry axis.

3. The word line layout as claimed in claim 2, wherein the positions where the first segments and the second segments are connected to each other move away from the symmetry axis as the first word lines and the second word lines move away from the third word line.

4. The word line layout as claimed in claim 1, wherein in the first direction or the second direction, spacings between adjacent ones of the first word lines of the first word line group are equal and spacings between adjacent ones of the second word lines of the second word line group are equal.

5. The word line layout as claimed in claim 1, further comprising a plurality of connection segments connecting the first segments and the second segments of the first word lines and connecting the first segments and the second segments of the second word lines, wherein the connection segments are curves or straight lines.

6. The word line layout as claimed in claim 1, wherein a spacing between the third word line and the first and second word line groups is greater than or equal to a spacing between adjacent ones of the first segments of the first word lines and greater than or equal to a spacing between adjacent ones of the first segments of the second word lines.

7. The word line layout as claimed in claim 1, wherein in the first word lines and the second word lines, a spacing between adjacent ones of the first segments is greater than a spacing between adjacent ones of the second segments.

8. The word line layout as claimed in claim 1, further comprising a plurality of protection layers disposed on the first segments of the first word lines and the second word lines.

9. The word line layout as claimed in claim 8, further comprising a protection layer disposed on the third word line.

10. The word line layout as claimed in claim 8, wherein a material of the protection layer comprises silicon.

11. The word line layout as claimed in claim 1, wherein the word line layout is symmetric with respect to the symmetry axis.

12. A method of forming a word line layout, comprising:
   providing a substrate;
   forming a mask layer on the substrate;
   patterning the mask layer to form a patterned mask layer comprising a plurality of L-shaped first masks, a plurality of L-shaped second masks, and a T-shaped third mask, wherein the L-shaped first masks and the L-shaped second masks are arranged in juxtaposition and symmetric to each other, and a portion of the T-shaped third mask is disposed between the L-shaped first masks and the L-shaped second masks;
   forming a plurality of spacers on sidewalls of the patterned mask layer, and
   removing the patterned mask layer and leaving the spacers, wherein the spacers form the word line layout as claimed in claim 1.

13. The method as claimed in claim 12, wherein in the L-shaped first masks, each of the first masks has a first portion and a second portion connected to each other, wherein the first portion extends along a first direction, the second portion extends along a second direction perpendicular to the first direction;

in the L-shaped second masks, each of the second masks has a first portion and a second portion connected to each other, wherein the first portion extends in the first direction, the second portion extends in the second direction, and the L-shaped first masks are symmetric to the L-shaped second masks with respect to a symmetry axis parallel to the second direction; and the T-shaped third mask has a first portion and a second portion connected to each other, wherein the first portion is disposed on an outer side of the L-shaped first masks and the L-shaped second masks, the first portion extends in the first direction and crosses the symmetry axis, and the second portion is disposed on the symmetry axis and extends in the second direction.

14. The method as claimed in claim 12, further comprising removing the I-shaped third word line after removing the patterned mask layer.

15. The method as claimed in claim 14, further comprising forming a plurality of protection layers on the first segments of the L-shaped first word lines and the L-shaped second word lines after removing the I-shaped third word line.

16. The method as claimed in claim 12, wherein the patterned mask layer has an odd number of masks.

17. The method as claimed in claim 13, wherein a spacing between the first portion of the T-shaped third mask and the L-shaped first and second masks is equal to a spacing between adjacent ones of the first portions of the L-shaped first masks and equal to a spacing between adjacent ones of the first portions of the L-shaped second masks.

18. The method as claimed in claim 13, wherein in the L-shaped first masks and the L-shaped second masks, a width of the first portions is greater than a width of the second portions.

19. The method as claimed in claim 18, wherein a width of the first portion of the T-shaped third mask is greater than the width of the first portions of the L-shaped first masks and the L-shaped second masks.

20. The method as claimed in claim 12, wherein forming the spacers on the sidewalls of the patterned mask layer comprises:

conformally forming a spacer material layer on the substrate and on a top surface and the sidewalls of the patterned mask layer; and etching the spacer material layer to expose a top surface of the substrate and the top surface of the patterned mask layer.

* * * * *